US008873236B1

(12) United States Patent
Tamarkin et al.

(10) Patent No.: US 8,873,236 B1
(45) Date of Patent: Oct. 28, 2014

(54) ELECTRONIC DEVICES HAVING COOLING MODULE WITH DIRECTION-CONFIGURABLE AIRFLOW

(75) Inventors: Vladimir Tamarkin, Huntingdon Valley, PA (US); Mark W. Wessel, Aston, PA (US)

(73) Assignee: QLOGIC, Corporation, Aliso Viejo, CA (US)

(*) Notice: Subject to any disclaimer, the term of this patent is extended or adjusted under 35 U.S.C. 154(b) by 378 days.

(21) Appl. No.: 13/397,002

(22) Filed: Feb. 15, 2012

Related U.S. Application Data

(60) Provisional application No. 61/545,008, filed on Oct. 7, 2011.

(51) Int. Cl.
H05K 7/20 (2006.01)
F04D 29/60 (2006.01)

(52) U.S. Cl.
CPC .......... *F04D 29/601* (2013.01); *H05K 7/20709* (2013.01); *H05K 7/20718* (2013.01); *H05K 7/20172* (2013.01); *H05K 7/20727* (2013.01); *H05K 7/20* (2013.01); *H05K 7/20736* (2013.01)
USPC ...................................... 361/695; 361/679.48

(58) Field of Classification Search
CPC . H05K 7/20; H05K 7/20709; H05K 7/20718; H05K 7/20727; H05K 7/20736; H05K 7/20172; F04D 29/601
USPC ............................................ 361/679.48, 695
See application file for complete search history.

(56) References Cited

U.S. PATENT DOCUMENTS

| 2,644,390 | A | * | 7/1953 | Delf et al. | 454/209 |
|---|---|---|---|---|---|
| 2,759,412 | A | * | 8/1956 | Knapp | 454/209 |
| 6,040,981 | A | * | 3/2000 | Schmitt et al. | 361/695 |
| 6,215,664 | B1 | * | 4/2001 | Hernandez et al. | 361/725 |
| 6,317,320 | B1 | * | 11/2001 | Cosley et al. | 361/695 |
| 6,587,342 | B1 | * | 7/2003 | Hsu | 361/695 |
| 6,711,015 | B2 | * | 3/2004 | Syring et al. | 361/695 |
| 7,054,155 | B1 | * | 5/2006 | Mease et al. | 361/695 |
| 7,492,591 | B1 | * | 2/2009 | Aybay et al. | 361/695 |
| 7,580,259 | B2 | * | 8/2009 | Hsiao | 361/695 |
| 7,633,755 | B2 | * | 12/2009 | Zhou et al. | 361/697 |
| 7,821,788 | B2 | * | 10/2010 | Hsiao | 361/695 |
| 7,916,471 | B2 | * | 3/2011 | Miyamoto et al. | 361/679.5 |
| 8,064,199 | B2 | * | 11/2011 | Lin | 361/695 |
| 8,068,340 | B1 | * | 11/2011 | Nguyen et al. | 361/695 |
| 8,089,754 | B2 | * | 1/2012 | Peng et al. | 361/679.48 |
| 8,320,120 | B1 | * | 11/2012 | Chan et al. | 361/679.49 |
| 8,322,405 | B2 | * | 12/2012 | Tang et al. | 165/80.3 |
| 8,351,205 | B2 | * | 1/2013 | Tang et al. | 361/695 |
| 8,385,064 | B1 | * | 2/2013 | Smith et al. | 361/695 |
| 8,451,605 | B2 | * | 5/2013 | Chen | 361/695 |
| 8,625,276 | B2 | * | 1/2014 | Chen et al. | 361/694 |
| 2003/0147213 | A1 | * | 8/2003 | Syring et al. | 361/695 |

(Continued)

*Primary Examiner* — Anatoly Vortman
(74) *Attorney, Agent, or Firm* — Klein, O'Neill & Singh, LLP

(57) ABSTRACT

An electronic device with a housing or enclosure. At least one heat-generating electronic component is contained within the housing. The electronic device further comprises a fan module configured to direct cooling air over the at least one heat-generating electronic component. The fan module is pivotably secured to the housing and capable of pivoting through at least 180°, such that the cooling air can be directed in a front-to-back flow path or a back-to-front flow path. Either of a manufacturer and a customer can reconfigure the direction of airflow.

16 Claims, 3 Drawing Sheets

(56) References Cited

U.S. PATENT DOCUMENTS

| | | | |
|---|---|---|---|
| 2004/0005855 A1* | 1/2004 | Giraldo et al. | 454/184 |
| 2004/0121719 A1* | 6/2004 | Robison et al. | 454/143 |
| 2007/0256813 A1* | 11/2007 | Ho | 165/80.3 |
| 2008/0041561 A1* | 2/2008 | Zhou et al. | 165/80.3 |
| 2008/0101021 A1* | 5/2008 | Sanchez et al. | 361/695 |
| 2010/0314080 A1* | 12/2010 | Cao et al. | 165/121 |
| 2011/0067836 A1* | 3/2011 | Tang et al. | 165/67 |
| 2011/0100600 A1* | 5/2011 | Tang et al. | 165/96 |
| 2011/0103015 A1* | 5/2011 | Hirano et al. | 361/695 |
| 2011/0317362 A1* | 12/2011 | Chen | 361/695 |

* cited by examiner

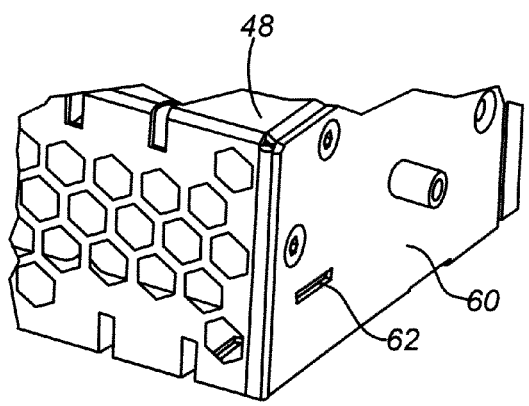 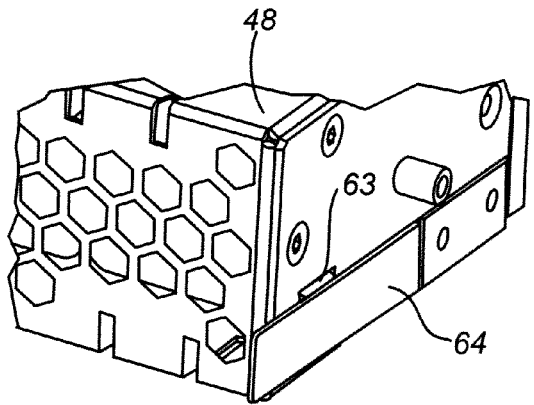
FIG. 3　　　　　　　　FIG. 4
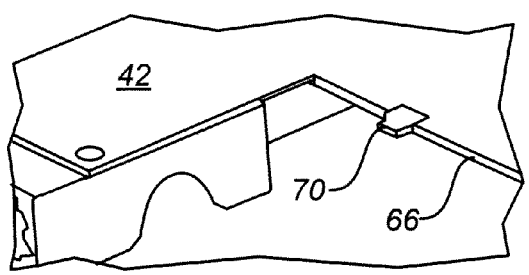
FIG. 5
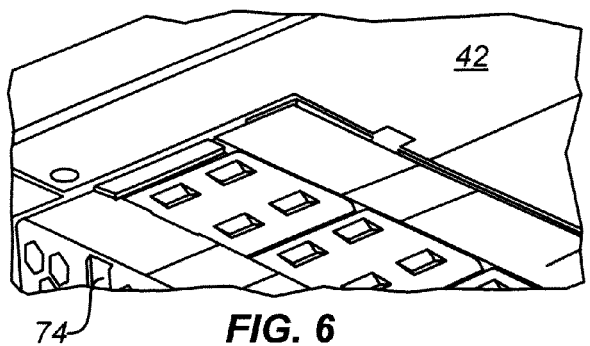
FIG. 6

ELECTRONIC DEVICES HAVING COOLING MODULE WITH DIRECTION-CONFIGURABLE AIRFLOW

CROSS-REFERENCE TO RELATED APPLICATION

This application claims priority to provisional application Ser. No. 61/545,008, filed on Oct. 7, 2011, the entire contents of which are hereby incorporated by reference.

BACKGROUND

The present invention relates to cooling of electronic devices.

DESCRIPTION OF RELATED ART

Network systems are commonly used to move network information (may also be referred to interchangeably, as frames, packets or commands) between computing systems (for example, servers) or between computing systems and network devices (for example, storage systems). Various network devices are used to implement network communication, including switches.

Network devices typically contain at least one heat-generating electronic component, such as an integrated circuit device or chip. It is desirable to transfer the heat generated by these electronic components away from the electronic components, because overheating can cause the performance of the electronic components to degrade. Fans are typically used this purpose. The fans are typically integrated into their respective network devices, and are not configurable to adjust a direction of airflow through a given network device.

SUMMARY

The various embodiments of the present electronic devices having cooling module with direction-configurable airflow have several features, no single one of which is solely responsible for their desirable attributes. Without limiting the scope of the present embodiments as expressed by the claims that follow, their more prominent features now will be discussed briefly. After considering this discussion, and particularly after reading the section entitled "Detailed Description," one will understand how the features of the present embodiments provide the advantages described herein.

One embodiment of the present electronic devices comprises a housing having a front and a back. The electronic device further comprises at least one heat-generating electronic component within the housing. The electronic device further comprises a fan module including at least one fan. The fan module is configured to direct cooling air over the at least one heat-generating electronic component. The fan module is pivotably secured to the housing and is capable of pivoting through at least 180°, such that the cooling air can be directed in a front-to-back flow path or a back-to-front flow path.

Another embodiment of the present electronic devices comprises a housing and at least one heat-generating electronic component within the housing. The electronic device further comprises a fan module coupled to the housing. The fan module includes at least one fan. An orientation of the fan module with respect to the housing may be reversed without decoupling the fan module from the housing.

BRIEF DESCRIPTION OF THE DRAWINGS

The various embodiments of the present electronic devices having cooling module with direction-configurable airflow now will be discussed in detail with an emphasis on highlighting the advantageous features. These embodiments depict the novel and non-obvious electronic devices having cooling module with direction-configurable airflow shown in the accompanying drawings, which are for illustrative purposes only. These drawings include the following figures, in which like numerals indicate like parts:

FIGS. 3 and 4 are detail rear perspective views of a locking mechanism for the electronic device of FIG. 1;

FIGS. 5 and 6 are detail rear perspective views of a rotation limiting mechanism for the electronic device of FIG. 1;

DETAILED DESCRIPTION

Figure 1:
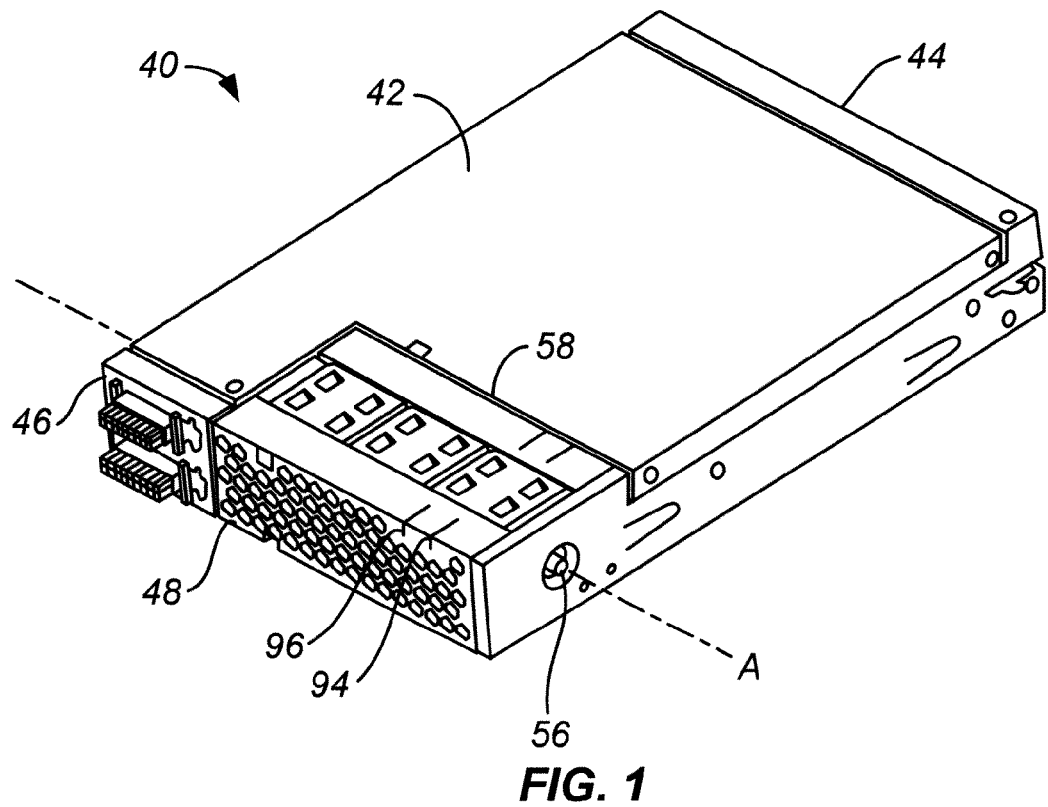
FIG. 1 is an upper rear perspective view of one embodiment of the present electronic device having cooling module with direction-configurable airflow.

The following detailed description describes the present embodiments with reference to the drawings. In the drawings, reference numbers label elements of the present embodiments. These reference numbers are reproduced below in connection with the discussion of the corresponding drawing features.

Briefly, the present embodiments comprise an electronic device with a housing or enclosure having a front and a back. At least one heat-generating electronic component is contained within the housing. The electronic device further comprises a fan module configured to direct cooling air over the at least one heat-generating electronic component. The fan module is pivotably secured to the housing and capable of pivoting through at least 180°, such that the cooling air can be directed in a front-to-back flow path or a back-to-front flow path. Either of a manufacturer and a customer can reconfigure the direction of airflow.

In another embodiment, the electronic device may be a cooling module configured for use in electronic equipment, such as a system chassis. The cooling module thus cools electronic devices within the system chassis, and provides configurable airflow for the system chassis.

With reference to FIG. 1, the device 40 includes a housing 42 having a front 44 and a back 46. The housing 42 may contain at least one heat-generating electronic component (not shown). For example, the device 40 may be a network device, such as a switch, but could be any type of electronic device. Alternatively, the device 40 may be a cooling module configured to plug into and cool electronic devices within a system chassis.

Figure 2:
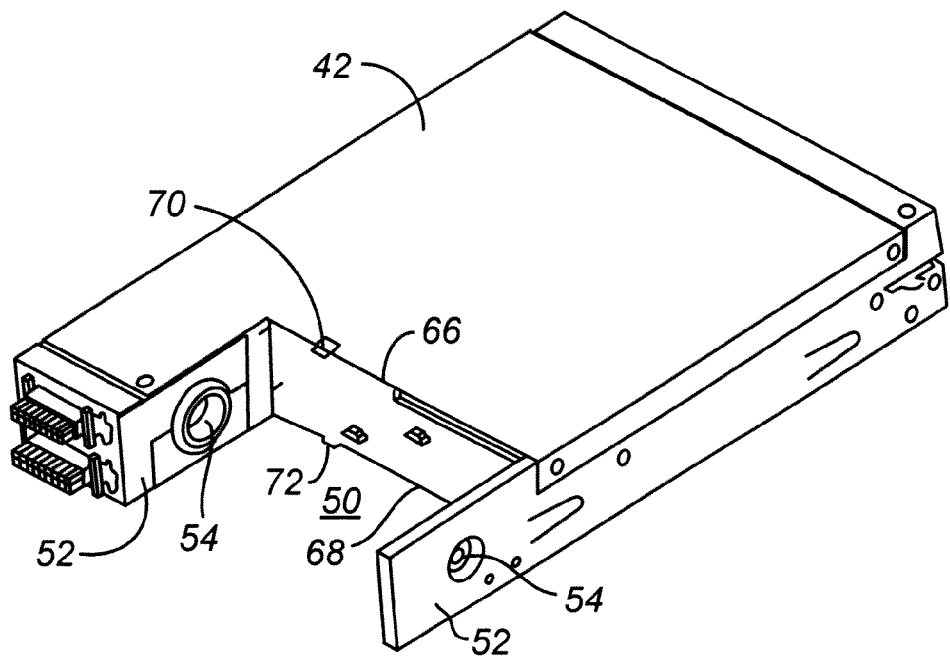
FIG. 2 is an upper rear perspective view of the electronic device of FIG. 1 with the fan module removed.

A fan module 48 is disposed at the back 46 of the device 40. The fan module 48 includes one or more fans (not shown) that are configured to direct cooling air over the at least one heat-generating electronic component contained within the housing 42, or toward an electronic device (not shown) into which the device 40 is plugged. With reference to FIGS. 1 and 2, the housing 42 includes a space 50 for receiving the fan module 48. Opposed walls 52 of the space 50 include holes 54 (FIG. 2) that receive pivot pins 56 (FIG. 1) that extend from opposite sides of the fan module 48. The fan module 48 is configured to rotate around the pivot pins 56 through at least 180°, such that cooling air can be directed along a front-to-back flow path or along a back-to-front flow path, as described below. With reference to FIG. 1 clearance 58 between the fan module 48 and the housing 42 prevents interference between the two as the fan module 48 pivots about the pivot pins 56.

When the one or more fans within the fan module 48 rotate about their axes of rotation, they move air in a given direction based upon the direction of tilt of their blades and their direction of rotation. However, if the one or more fans are pivoted 180° about an axis that is perpendicular to their axes of rotation, then the direction of airflow that they generate is reversed. The present embodiments achieve that functionality and advantage by providing an electronic device 40 with a fan module 48 that can pivot with respect to a housing 42 of the device 40 about an axis A that is perpendicular to the axes of rotation of the fans. The direction of airflow is thus advantageously configurable by a manufacturer of the electronic device 40 or a customer who acquires the electronic device 40.

In certain embodiments, the fan module 48 may be locked against rotation once it is in the desired orientation. With reference to FIGS. 3 and 4, a side wall 60 of the fan module 48 includes a first slot 62 and a second slot (not shown). The first slot 62 corresponds to the front-to-back airflow orientation for the fan module 48, while the second slot corresponds to the back-to-front airflow orientation for the fan module 48. When the fan module 48 is in the desired orientation, a tab 63 on a spring latch 64 of the housing 42 mates with the first or second slot to lock the fan module 48 against undesired rotation.

In certain embodiments, rotation of the fan module 48 may be limited to 180° to prevent unrestricted spinning of the fan module 48. With reference to FIGS. 2, 5 and 6, the rear edges 66, 68 of the upper and lower walls of the housing 42 include upper and lower tabs 70, 72 (FIG. 2) that extend into the space 50 where the fan module 48 is received. Edges of the fan module 48 include corresponding slots 74 (FIG. 6). When the fan module 48 rotates in a first direction, first and second ones of the slots 74 will clear both tabs 70, 72 to enable 180° rotation, but upon reaching 180° from the original orientation, a third one of the slots 74 will engage the upper tab 72 to prevent further rotation in the first direction, as shown in FIG. 6. When the fan module 48 rotates in a second direction opposite the first direction, again, the first and second ones of the slots 74 will clear both tabs 70, 72 to enable 180° rotation, but upon reaching 180° from the original orientation, a fourth one of the slots 74 will engage the lower tab 70 to prevent further rotation in the second direction.

Figure 7:
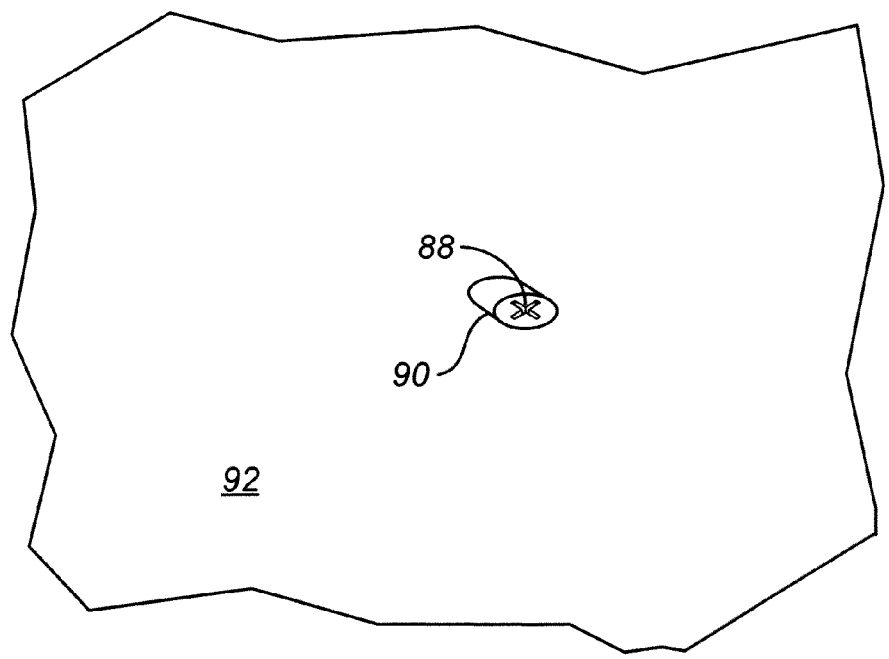
FIG. 7 is a detail perspective view of a keying mechanism access hole in a system enclosure for the electronic device of FIG. 1.
Figure 8:
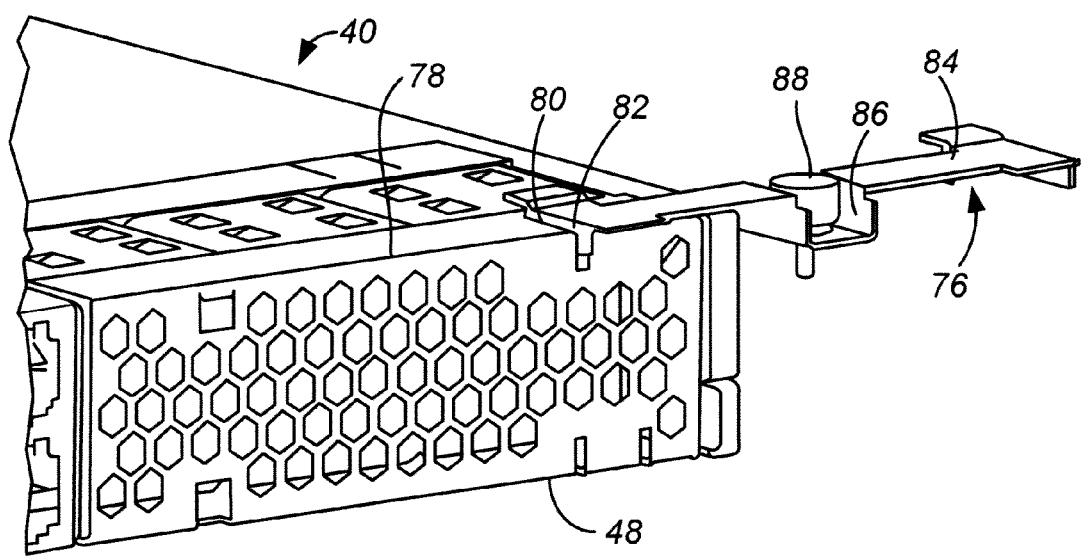
FIG. 8 is a rear perspective view of the electronic device of FIG. 1 illustrating details of a keying mechanism therefor.

With reference to FIGS. 7 and 8, the illustrated embodiment includes a keying mechanism 76 that ensures that the fan module 48 is oriented in the desired front-to-back or back-to-front airflow orientation. As shown in FIG. 8, the upper rear edge 78 of the fan module 48 includes a keying slot 80. A system chassis or system enclosure that receives the electronic device 40 includes a keying tab 82 that mates with the keying slot 80. An arm 84 extending from the system chassis that includes the keying tab 82 is shown in FIG. 8, while the remainder of the system chassis is omitted for clarity.

The keying slot 80 has two positions. When the fan module 48 is oriented for front-to-back airflow, the keying slot 80 is in a first position. When the fan module 48 is oriented for back-to-front airflow, the keying slot 80 is in a second position. The keying tab 82 on the system chassis is in either the first position or the second position, depending upon whether the system chassis is designed for front-to-back airflow or back-to-front airflow. Thus, the electronic device 40 will only be received in the system chassis if both the keying slot 80 and the keying tab 82 are in the first position, or if both the keying slot 80 and the keying tab 82 are in the second position. If the slot 80 and tab 82 are not aligned, the electronic device 40 will not be fully received within the system chassis, and the operator will thereby be alerted to the fact that the fan module 48 is not properly oriented with respect to the housing 42. The operator can then withdraw the electronic device 40 from the system chassis, pivot the fan module 48 with respect to the housing 42 to properly orient the fan module 48, and then reinsert the electronic device 40 within the system chassis.

With reference to FIGS. 7 and 8, the keying tab 82 on the system chassis is adjustable so that it can be placed in either the first position or the second position. The arm 84 extending from the system chassis includes a recess 86 that receives a screw 88. An access hole 90 (FIG. 7) in an upper wall 92 of the system chassis enables access to the screw 88 from outside the system chassis. Upon loosening the screw 88, the arm 84, and thereby the tab 82, can be shifted left-to-right or right-to-left between the first and second positions.

The embodiments described above enable configuration of a direction of airflow through the electronic device 40. In certain embodiments, other features may also be configured. For example, as shown in FIG. 1 the fan module 48 may include more than one keying slot. A first one 94 of the keying slots may correspond to configuring the direction of airflow through the electronic device 40, as described above. A second one 96 of the keying slots may correspond to configuring another feature, such as a type of power supply used in connection with the electronic device 40. A first position for the second keying slot 96 may correspond to a first type of power supply, while a second position for the second keying slot 96 may correspond to a second type of power supply. Additional keying slots may be employed beyond two. A number of keying slots present in the fan module 48 may correspond to a number of configurable features that may be controlled.

Advantageously, the present embodiments allow configuration of airflow direction by a customer in the field. Airflow direction is easily configurable without having to open the system chassis and expose the inside circuitry, which might require a skilled technician.

The above description presents the best mode contemplated for carrying out the present invention, and of the manner and process of making and using it, in such full, clear, concise, and exact terms as to enable any person skilled in the art to which it pertains to make and use this invention. This invention is, however, susceptible to modifications and alternate constructions from that discussed above that are fully equivalent. Consequently, this invention is not limited to the particular embodiments disclosed. On the contrary, this invention covers all modifications and alternate constructions coming within the spirit and scope of the invention as generally expressed by the following claims, which particularly point out and distinctly claim the subject matter of the invention.

What is claimed is:

1. An electronic device, comprising:
a housing having a front and a back, and defining a receiving space;
at least one heat-generating electronic component within the housing; and
a fan module including at least one fan, the fan module being configured to direct cooling air over the at least one heat-generating electronic component;
wherein the fan module is received within the receiving space of the housing and pivotably secured to the housing, and wherein the fan module is pivotable through 180° with respect to the housing, such that the cooling air can be directed in a front-to-back flow path or a back-to-front flow path through the housing;

further comprising a rotation limiting mechanism that limits pivoting of the fan module with respect to the housing to 180°;

wherein the rotation limiting mechanism comprises a first tab extending from the housing into the receiving space, a second tab extending from the housing into the receiving space, a first slot in the housing, and a second slot in the housing; and wherein when the fan module occupies a first orientation with respect to the housing in which the cooling air is directed in the front-to-back flow path, the first tab engages the first slot and the second tab is spaced from the second slot, and when the fan module occupies a second orientation with respect to the housing in which the cooling air is directed in the back-to-front flow path, the second tab engages the second slot and the first tab is spaced from the first slot.

2. The electronic device of claim 1, wherein the fan module includes first and second pivot pins that define a pivot axis of the fan module.

3. The electronic device of claim 2, wherein the housing includes first and second holes that receive the first and second pivot pins.

4. The electronic device of claim 1, further comprising a clearance between the housing and the fan module that prevents interference between the fan module and the housing when the fan module is pivoted with respect to the housing.

5. The electronic device of claim 1, further comprising a locking mechanism that prevents the fan module from pivoting with respect to the housing until the locking mechanism is disengaged.

6. The electronic device of claim 5, wherein the locking mechanism comprises a slot in one of the housing or the fan module, and a mating tab on the other of the housing or the fan module.

7. The electronic device of claim 1, further comprising a keying mechanism that ensures that the fan module is oriented in a desired one of the front-to-back or back-to-front airflow orientations.

8. The electronic device of claim 7, wherein the keying mechanism comprises a keying slot in one of the fan module or a system chassis that receives the fan module, and a mating keying tab on the other of the fan module or the system chassis, wherein at least one of the keying slot and the keying tab is movable between first and second positions, and the fan module may not be received by the system chassis unless the keying slot and the keying tab are aligned.

9. An electronic device, comprising:
a housing having a back side;
at least one heat-generating electronic component within the housing;
a fan module pivotably coupled to the housing, the fan module including at least one fan, wherein a rotational orientation of the fan module with respect to the housing may be reversed without decoupling the fan module from the housing; and
a keying mechanism that ensures that the fan module is oriented in a desired one of a first rotational orientation or a second rotational orientation with respect to the housing;

wherein the keying mechanism comprises a first keying slot in the fan module and a second keying slot in the fan module; and wherein when the fan module is oriented in the first rotational orientation with respect to the housing the first keying slot is positioned adjacent the back side of the housing while the second keying slot is spaced from the back side of the housing, and when the fan module is oriented in the second rotational orientation with respect to the housing the second keying slot is positioned adjacent the back side of the housing while the first keying slot is spaced from the back side of the housing.

10. The electronic device of claim 9, wherein the fan module is pivotable with respect to the housing, and includes first and second pivot pins that define a pivot axis of the fan module.

11. The electronic device of claim 10, wherein the housing includes first and second holes that receive the first and second pivot pins.

12. The electronic device of claim 10, further comprising a rotation limiting mechanism that limits pivoting of the fan module with respect to the housing to no more than 180°.

13. The electronic device of claim 12, wherein the rotation limiting mechanism comprises a plurality of slots in one of the housing or the fan module, and a plurality of tabs on the other of the housing or the fan module.

14. The electronic device of claim 9, further comprising a clearance between the housing and the fan module that prevents interference between the fan module and the housing when the orientation of the fan module with respect to the housing is reversed.

15. The electronic device of claim 9, further comprising a locking mechanism that prevents the orientation of the fan module with respect to the housing from being reversed until the locking mechanism is disengaged.

16. The electronic device of claim 15, wherein the locking mechanism comprises a slot in one of the housing or the fan module, and a mating tab on the other of the housing or the fan module.

* * * * *

UNITED STATES PATENT AND TRADEMARK OFFICE
CERTIFICATE OF CORRECTION

| | | |
|---|---|---|
| PATENT NO. | : 8,873,236 B1 | Page 1 of 1 |
| APPLICATION NO. | : 13/397002 | |
| DATED | : October 28, 2014 | |
| INVENTOR(S) | : Tamarkin et al. | |

It is certified that error appears in the above-identified patent and that said Letters Patent is hereby corrected as shown below:

In the Specification,

In column 3, line 1, delete "1" and insert -- 1, a --, therefor.

In the Claims,

In column 6, line 25, in Claim 10, before "includes" delete "is pivotable with respect to the housing, and", therefor.

Signed and Sealed this
Fourteenth Day of April, 2015

Michelle K. Lee
*Director of the United States Patent and Trademark Office*